United States Patent [19]

Tabata et al.

[11] Patent Number: 5,354,732
[45] Date of Patent: Oct. 11, 1994

[54] PYROELECTRIC IR SENSOR USING AN OXIDE SUPERCONDUCTOR UPPER ELECTRODE

[75] Inventors: Hitoshi Tabata, Akashi; Osamu Murata, Kobe; Junzo Fujioka; Shunichi Minakata, both of Akashi; Tomoji Kawai, Minoo; Shichio Kawai, Suita, all of Japan

[73] Assignee: Kawasaki Jukogyo Kabushiki Kaisha, Hyogo, Japan

[21] Appl. No.: 997,187

[22] Filed: Dec. 28, 1992

[30] Foreign Application Priority Data

Dec. 27, 1991 [JP] Japan ................. 3-361439

[51] Int. Cl.$^5$ .................. G01J 5/00; H01L 39/00
[52] U.S. Cl. .................. 505/160; 505/701; 505/191; 250/338.3; 250/338.1; 250/336.2; 427/62
[58] Field of Search .......... 505/1, 701, 706; 427/62, 596, 419.3, 419.2; 250/336.2, 338.3, 336.2

[56] References Cited

U.S. PATENT DOCUMENTS

| | | | |
|---|---|---|---|
| 4,032,783 | 6/1977 | Koda | 250/333 |
| 5,168,420 | 12/1992 | Ramesh et al. | 505/1 |
| 5,264,375 | 11/1993 | Bang et al. | 437/3 |
| 5,270,555 | 12/1993 | Ito et al | 257/81 |

FOREIGN PATENT DOCUMENTS 1-143258 6/1989 Japan.

OTHER PUBLICATIONS

Tabata et al, "Preparation of PbTiO$_3$ thin films by an Excimer laser ablation technique with second laser irradiation", Jpn. J. Appl. Phys. vol. 31(9B) Sep. 1992 pp. 2968-2970.

Masanori Okuyama et al., "Room-Temperature-Operated Infrared Image CCD Sensor Using Pyroelectric Gate Coupled by Dielectric Connector", May 1991, IEEE Transactions on Electron Devices, vol. 38, No. 6, pp. 1145-1151.

*Primary Examiner*—Roy V. King
*Attorney, Agent, or Firm*—Oliff & Berridge

[57] ABSTRACT

An electrode in an electronic device using a functional thin film facilitates epitaxial growth during the functional material film-forming process and prevents the generation of cracks due to thermal stress. An oxide superconductor is using as an electrode material, thereby forming the crystal structure identical with the crystal structure of a functional thin film, and rendering their lattice constant and coefficient of thermal expansion close to the lattice constant and coefficient of thermal expansion functional thin film. According to the electrode material, high electric conductivity, low thermal conductivity and large thermal absorption coefficient characteristics can also be obtained.

1 Claim, 2 Drawing Sheets

PYROELECTRIC IR SENSOR USING AN OXIDE SUPERCONDUCTOR UPPER ELECTRODE

BACKGROUND OF THE INVENTION

This invention relates to an electronic device using a functional thin film such as a pyroelectric IR sensor and, more particularly, to an electronic device using a functional thin film wherein its electrode material is improved.

For example, Japanese Patent Laid-Open Publication No. 143258/1989 describes pyroelectric sensors wherein a pyroelectric element plate is formed from $PbTiO_3$, Al or Pt is used as its lower electrode and NiCr is used as an upper electrode which acts also as an infrared absorption layer. Besides the foregoing, it also is known that Sn doped $In_2O_3$ (ITO) be used as a lower electrode and that Al or gold black be used as an upper electrode.

When the metal or ITO is used as electrodes in the prior art, the following disadvantages occur in connection with the functional materials such as $PbTiO_3$.

(i) The crystal structure of $PbTiO_3$ and the like is fundamentally different from that of the metals and the like and therefore it is difficult to carry out epitaxial growth in forming $PbTiO_3$ and the like by a thin film technique such as a laser ablation method.

(ii) The coefficient of thermal expansion of $PbTiO_3$ and the like is greatly different from that of the metals and the like and therefore cracks and lattice defects are liable to occur due to the thermal stress during the film-forming process.

(iii) The metal electrode formed by the laser ablation method has an inferior surface, the metal electrode can have defects such as pinholes and such drawbacks are reasons why sensors having defects are produced.

(iv) The metals and the like have a high thermal conductivity, and therefore an incident energy cannot be effectively transformed into output charge in applying them to a pyroelectric IR sensor.

(v) The metals and the like have small emissivity (thermal absorption coefficient) and therefore it is disadvantageous to use the metals and the like as the upper electrode (light-receptive portion) of the pyroelectric IR sensor from the standpoint of efficiency.

An object of the present invention is to provide an electronic device using a functional thin film by which the above drawbacks (i) through (v) of the prior art can be solved.

SUMMARY OF THE INVENTION

An electronic device using a functional thin film of claim 1 is characterized in that an electrode which comes into contact with a functional thin film of an oxide such as $PbTiO_3$ is formed from an oxide superconductor or oxide semiconductor.

An electronic device using a functional thin film of claim 2 is characterized in that said oxide superconductor is selected from the group consisting of composite oxides containing lanthanides, composite oxides containing bismuth, composite oxides containing thallium and composite oxides containing strontium.

DETAILED DESCRIPTION OF THE INVENTION

Figure 1:
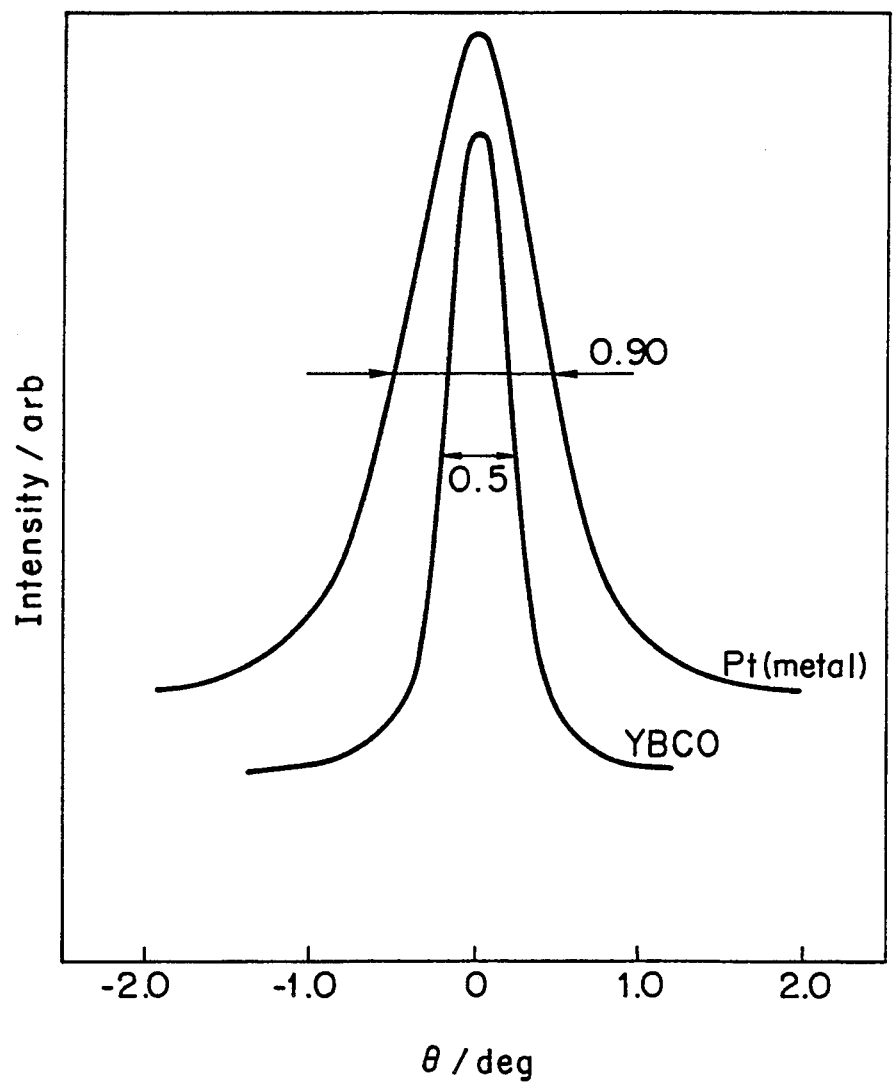
FIG. 1 is a graph showing the full width at half maxim of the rocking curve of $PbTiO_3$ thin films of Example and Comparative Example.

Examples of oxide superconductors include the following oxide superconductors (1) through (5).

| | | |
|---|---|---|
| (1) | Composite oxide containing Ln (lanthanide): | |
| | $(Ln_{1-x}M_x)_2CuO_4$ | $(0 \leq x \leq 1)$ |
| | $Ln_1M_2Cu_3O_{7-y}$ | $(0 \leq y \leq 1)$ | wherein Ln represents La, Nd, Sm, Eu, Gd, Y, Dy, Ho, Er, Tm, Yb or the like; and M represents Ba, Sr, Ca or the like.

| | | |
|---|---|---|
| (2) | Composite oxide containing Bi: | |
| | $Bi_2Sr_2Ca_{n-1}Cu_nO_{2n+4}$ | $(n = 1 - 8)$ |
| | $Ba_{1-x}K_xBiO_3$ | $(0 \leq x \leq 1)$ |
| | $Bi_{1-x}Pb_xBaO_3$ | |
| (3) | Composite oxide containing Tl: | |
| | $Tl_2Ba_2Ca_{n-1}Cu_nO_{2n+4}$ | $(n = 1 - 3)$ |
| | $TlBa_2Ca_{n-1}Cu_nO_{2n+3}$ | $(n = 1 - 4)$ |
| (4) | Composite oxide containing Sr: | |
| | $SrCuO_2$ | |
| | $(Sr_{1-x}Ca_x)CuO_2$ | |
| (5) | Other composite oxide containing Cu: | |
| | $Pb_2Sr_2RCu_3O_8$ | | wherein R represents a rare earth element.

Examples of oxide semiconductors include NiO, $Cr_2O_3$, $Cu_2O$, $MnO_2$, ZnO, $V_2O_5$, $Fe_2O_3$, $TiO_2$ and $SrTiO_3$(Nb-doped).

First, the crystal structures are described. Both functional materials as ferroelectrics and pyroelectric materials and electrodes are oxides and therefore they have the same crystal structure (e.g., perovskite structure). The materials having similar lattice constant can be readily selected and therefore functional materials are susceptible to epitaxial growth in forming a film of a functional material by a thin film technique such as a laser ablation method.

The coefficient of thermal expansion is described. The coefficient of thermal expansion of the present electrode material is close to that of the functional material as compared with the metals and therefore defects such as cracks and stacking faults attributable to thermal stress during the production process can be prevented.

The thermal conductivity and electric conductivity are described. For example, when the materials are applied to a pyroelectric IR sensor, electrodes having large electric conductivity and small thermal conductivity are required. This is because improvement in sensitivity can be achieved by reducing thermal diffusion at the electrodes. In the case of the metals, free electrons greatly participate in their thermal conductivity and electric conductivity as shown by a Wiedemann-Franz' equation and therefore it is difficult to separately control each of thermal conductivity and electric conductivity. On the contrary, in the case of the oxide superconductors, their electrical characteristics can be varied from semiconductors to superconductors, even to metals by the doping amount of a carrier. It is suitable that materials having a region exhibiting superconduction characteristics through a region exhibiting metallic characteristics be used as an electrode material of the present invention. With respect to thermal conduction, in the case of the metals, a predominant factor is free electrons whereas in the case of the oxides, a predominant factor is phonons. Thus, materials of electrode having large electric conductivity and small thermal conductivity can be produced by using the oxide superconductors and oxide semiconductors as described above.

The smoothness is described. The oxide superconductive thin film formed by a laser ablation method has improved surface state.

The emissivity (thermal absorption coefficient) is described. The oxide superconductors and the like have emissivity larger than that of the metals. Therefore, when the oxide superconductors and the like are used as an upper electrode of a pyroelectric IR sensor, its output charge can be increased (see FIG. 2).

EXAMPLE

A lower electrode was formed on an MgO substrate under the following conditions by a laser ablation method.

| | |
|---|---|
| Type of laser: | ArF excimer laser |
| Laser intensity: | 1 J/cm$^2$ |
| Repetitive frequency of laser: | 15 Hz |
| Substrate: | MgO (100) |
| Substrate temperature: | 600° C. |
| Target: | YBa$_2$Cu$_3$O$_7$ |

A functional thin film was formed on the thus obtained lower electrode under the following conditions by a laser ablation (hereinafter referred to as Example):

| | |
|---|---|
| Type of laser: | ArF excimer laser |
| Laser intensity | 1 J/cm$^2$ |
| Repetitive frequency of laser: | 15 Hz |
| Substrate temperature: | 600° C. |
| Target: | PbTiO$_3$ |

For comparison, a Pt lower electrode was formed on an MgO substrate by a laser ablation method and a PbTiO$_3$ thin film was formed thereon as described above (hereinafter referred to as Comparative Example).

It was observed that the Pt lower electrode of Comparative Example described above had an infinite number of unevenness at its surface whereas the surface state of the YBa$_2$Cu$_3$O$_7$ lower electrode of Example was smooth.

FIG. 1 shows X-ray diffraction patterns of PbTiO$_3$ thin films of Example and Comparative Example. The full width of half maxim of the rocking curve (about 0.5) of the PbTiO$_3$ thin film of Example is considerably narrower than that (about 0.9) of PbTiO$_3$ thin film of Comparative Example. As can be seen from the foregoing, the functional thin film of Example sufficiently oriented at a C axis is formed. For crystal structure, both PbTiO$_3$ and YBa$_2$Cu$_3$O$_7$ have a perovskite structure whereas Pt has a face-centered cubic structure. The lattice constant is 3.90 Å for PbTiO$_3$, 3.88 Å for YBa$_2$Cu$_3$O$_7$ and 3.92 Å for Pt.

Further, YBa$_2$Cu$_3$O$_7$ described above has a coefficient of thermal expansion close to that of PbTiO$_3$. In the present invention, the thermal conductivity and electric conductivity can be independently controlled whereas Pt has a large coefficient of thermal expansion and the thermal conductivity and electric conductivity cannot be independently controlled. Furthermore, from a view point of chemical etching, YBa$_2$Cu$_3$O$_7$ can be etched easier than metals (Pt, Au etc.). in this respect, YBa$_2$Cu$_3$O$_7$ is a material having excellent electrode characteristics of an electronic device.

Figure 2:
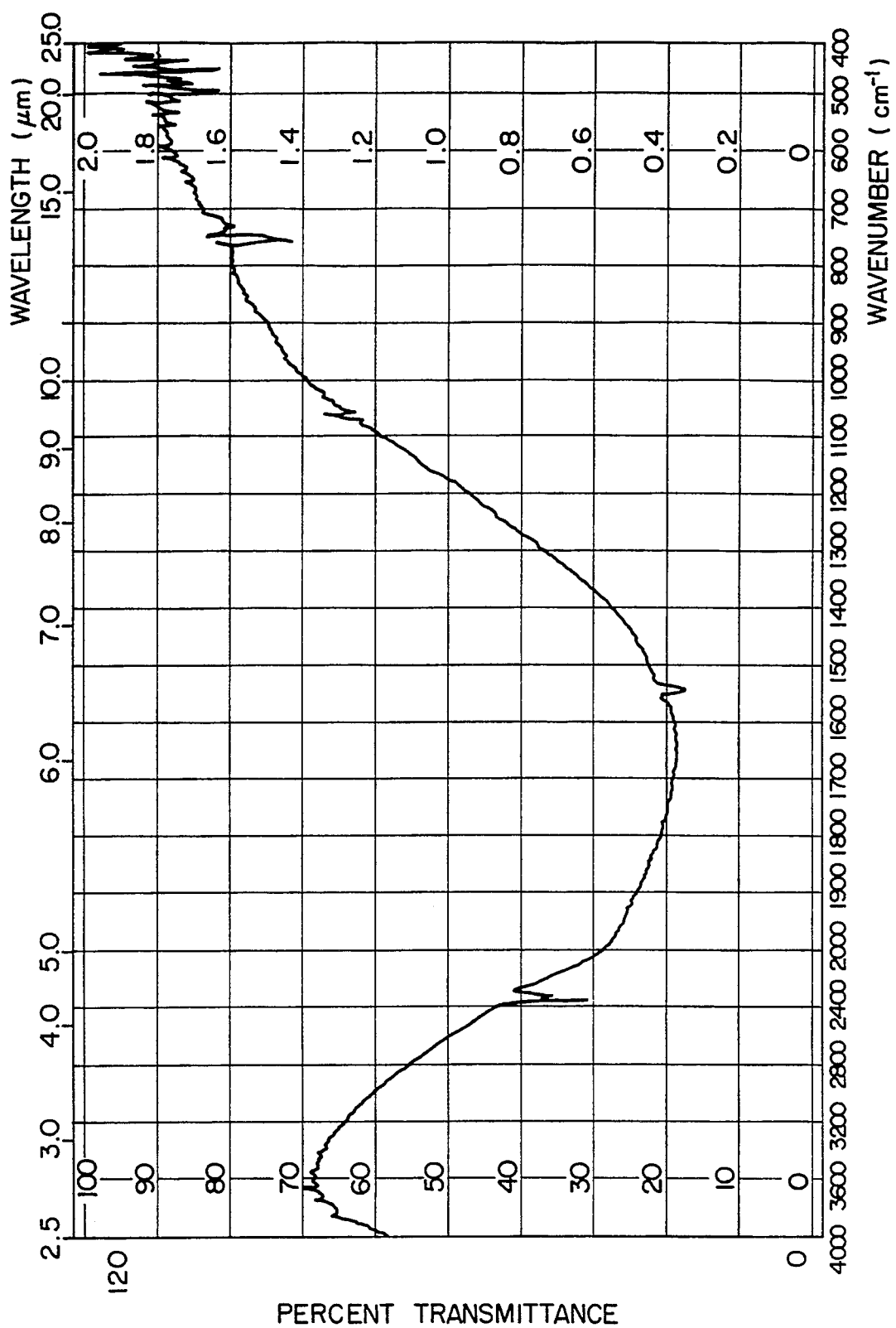
FIG. 2 is a graph showing the reflectivity (the inverse number of thermal absorption coefficient) of an oxide superconductor ($La_2CuO_4$), comparing with the metal (NiCr) as a standard sample.

YBa$_2$Cu$_3$O$_7$ described above has an emissivity as large as 90% whereas Pt has an emissivity of the order of from 50 to 60%. Accordingly, when YBa$_2$Cu$_3$O$_7$ is used as an upper electrode of a pyroelectric IR sensor (infrared absorption layer), increase in output charge of the order of about 30% can be achieved. FIG. 2 shows the reflectivity (the inverse number of thermal absorption coefficient) of the oxide superconductor (La$_2$CuO$_4$) comparing with that of Pt. As can be seen from FIG. 2, the oxide superconductor has a thermal absorption coefficient from 2 to 5 times that of Pt.

Besides the foregoing, a large effect can be achieved even if the present material is utilized only as an electrode material or as a thermal absorption material having high efficiency.

What is claimed is:

1. A pyroelectric IR sensor, comprising:
an upper electrode and a lower electrode formed to come into contact with the opposite surfaces of a functional thin film, the functional thin film being formed from an oxide ferroelectric material and the upper electrode acting also as an infrared absorption layer wherein the upper electrode is formed from an oxide superconductor selected from the group consisting of composite oxides containing lanthanides, composite oxides containing bismuth, composite oxides containing thallium and composite oxides containing strontium.

* * * * *